US012147164B2

(12) United States Patent
Nawata et al.

(10) Patent No.: US 12,147,164 B2
(45) Date of Patent: Nov. 19, 2024

(54) MOTION CONTROL APPARATUS, LITHOGRAPHY APPARATUS, PLANARIZATION APPARATUS, PROCESSING APPARATUS, AND ARTICLE MANUFACTURING METHOD

(71) Applicant: CANON KABUSHIKI KAISHA, Tokyo (JP)

(72) Inventors: Ryo Nawata, Tochigi (JP); Yuichiro Miki, Kanagawa (JP); Shota Takami, Chiba (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/062,117

(22) Filed: Dec. 6, 2022

(65) Prior Publication Data

US 2023/0194999 A1 Jun. 22, 2023

(30) Foreign Application Priority Data

Dec. 16, 2021 (JP) ................................. 2021-204437

(51) Int. Cl.
*G03F 7/00* (2006.01)
(52) U.S. Cl.
CPC .............................. *G03F 7/70775* (2013.01)
(58) Field of Classification Search
CPC ............................ G03F 7/70775; G03F 7/0002
See application file for complete search history.

(56) References Cited

U.S. PATENT DOCUMENTS

| | | | |
|---|---|---|---|
| 11,460,781 B2 | 10/2022 | Asano et al. | |
| 2015/0290871 A1* | 10/2015 | Okada | G03F 7/0002 264/40.7 |
| 2016/0170311 A1* | 6/2016 | Schmitt-Weaver | G03F 7/70516 355/67 |
| 2016/0223918 A1* | 8/2016 | Asano | G03F 9/7042 |
| 2018/0319075 A1* | 11/2018 | Asano | B29C 59/002 |
| 2019/0011844 A1* | 1/2019 | Kimura | G03F 9/7042 |
| 2020/0233316 A1* | 7/2020 | Asano | G03F 7/70725 |
| 2021/0223689 A1* | 7/2021 | Arakawa | G03F 7/0002 |
| 2022/0107610 A1* | 4/2022 | Nawata | G05B 13/027 |

(Continued)

FOREIGN PATENT DOCUMENTS

JP 2019071405 A 5/2019

*Primary Examiner* — Deoram Persaud
(74) *Attorney, Agent, or Firm* — ROSSI, KIMMS & McDOWELL LLP (57) ABSTRACT

A motion control apparatus includes a first movable part, a second movable part, a first measurement device for measuring a motion of the first movable part, a first compensator for generating a first manipulated variable based on an output from the first measurement device and a target value for controlling the motion of the first movable part, a generator for generating an observed value concerning a relative motion between the first movable part and the second movable part, a second compensator for generating a second manipulated variable based on the observed value, and a calculator for generating a manipulated variable for driving the first movable part based on an output from the first compensator and an output from the second compensator. For the second compensator, a parameter value for generating the second manipulated variable is decided by machine learning.

24 Claims, 10 Drawing Sheets

(56) References Cited

U.S. PATENT DOCUMENTS

| | | | |
|---|---|---|---|
| 2022/0309645 A1* | 9/2022 | Tenner | G03F 7/70633 |
| 2022/0390856 A1* | 12/2022 | Asano | G03F 7/70516 |
| 2023/0176548 A1* | 6/2023 | Kusayanagi | H01L 21/68 700/28 |
| 2023/0334331 A1* | 10/2023 | Nawata | G06N 3/092 |

* cited by examiner

MOTION CONTROL APPARATUS, LITHOGRAPHY APPARATUS, PLANARIZATION APPARATUS, PROCESSING APPARATUS, AND ARTICLE MANUFACTURING METHOD

BACKGROUND OF THE INVENTION

Field of the Invention

The present invention relates to a motion control apparatus, a lithography apparatus, a planarization apparatus, a processing apparatus, and an article manufacturing method.

Description of the Related Art

For a control apparatus that controls a physical amount of a control target, a classic controller such as a proportional-integral-derivative (PID) controller has been widely used. In recent years, in addition to control systems based on classic control theory and modern control theory, a control system constructed using machine learning such as reinforcement learning may be used. A control system that uses both a control system including no machine learning and a control system using machine learning may be used. According to Japanese Patent Laid-Open No. 2019-71405, by using a feedback control apparatus that uses both a control system including no machine learning and a control system using machine learning, a control deviation of a control target object that cannot be compensated for completely only by the control system including no machine learning is reduced by the control system using machine learning.

However, in a case where an apparatus includes a plurality of movable parts and the plurality of movable parts are to be relatively aligned with each other, even if each movable part is feedback-controlled by a method described in Japanese Patent Laid-Open No. 2019-71405, it would not be possible to improve the accuracy of a relative position (especially, a high-frequency component) among the plurality of movable parts.

SUMMARY OF THE INVENTION

The present invention provides a technique advantageous for an apparatus including a plurality of movable parts to accurately, relatively align the plurality of movable parts.

One of aspects of the present invention provides a motion control apparatus comprising: a first movable part; a second movable part; a first measurement device configured to measure a motion of the first movable part; a first compensator configured to generate a first manipulated variable based on an output from the first measurement device and a target value for controlling the motion of the first movable part; a generator configured to generate an observed value concerning a relative motion between the first movable part and the second movable part; a second compensator configured to generate a second manipulated variable based on the observed value; and a calculator configured to generate a manipulated variable for driving the first movable part based on an output from the first compensator and an output from the second compensator, wherein for the second compensator, a parameter value for generating the second manipulated variable is decided by machine learning.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Some embodiments of the present invention will be exemplified below. However, the present invention is not limited to them, and is applicable to various forms in which a function of controlling a relative motion between two movable parts is provided. In the following description, directions will be explained in accordance with the XYZ coordinate system.

First Embodiment

Figure 1:
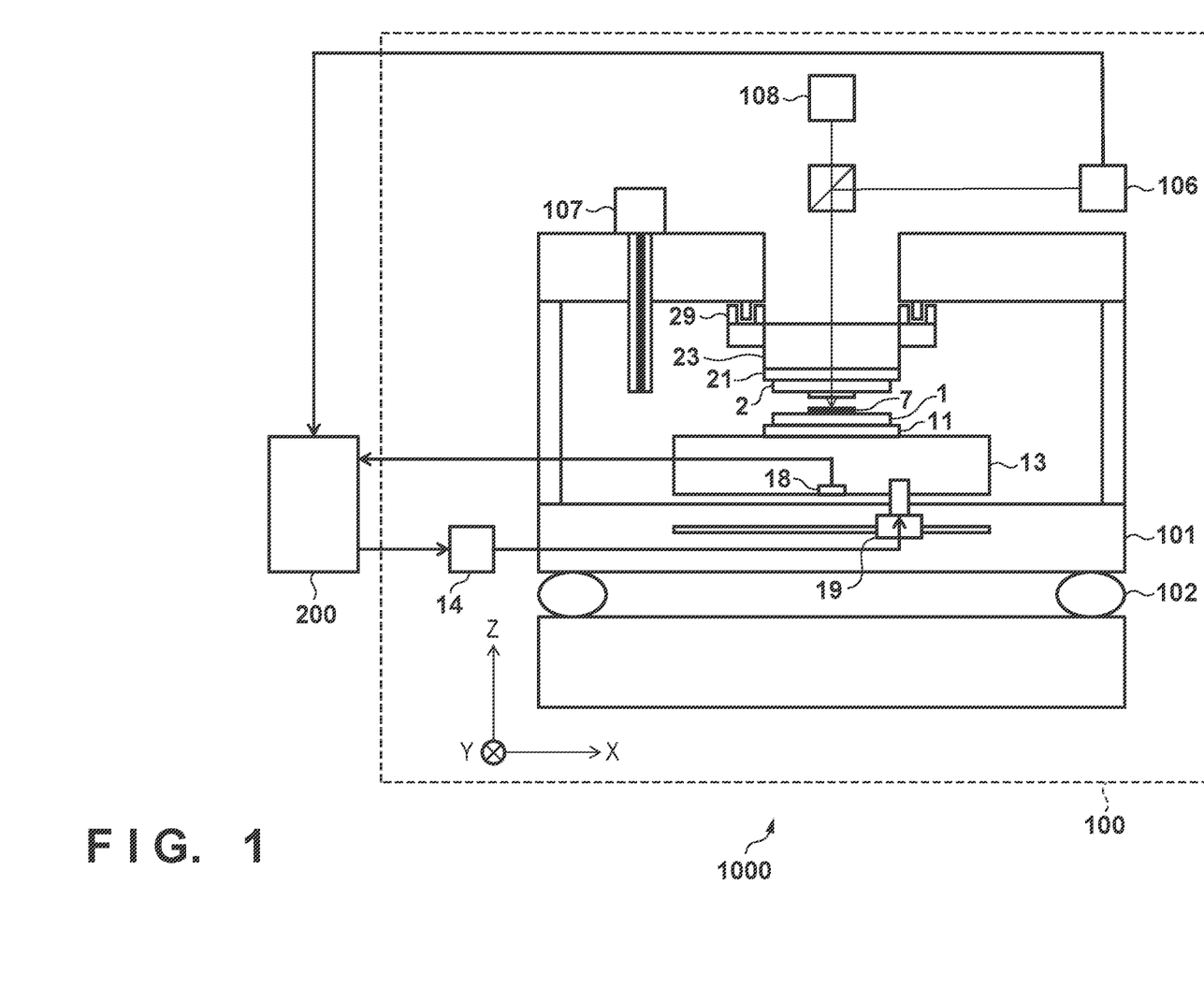
FIG. 1 is a schematic view showing the arrangement of an imprint apparatus according to the first embodiment.

The first embodiment provides an example in which the present invention is applied to an imprint apparatus as an example of a lithography apparatus that forms a pattern in a substrate. FIG. 1 is a schematic view of an imprint apparatus 1000 according to the first embodiment. The imprint apparatus 1000 transfers a pattern of a mold 2 as a second member to a substrate 1 as a first member. The imprint apparatus 1000 can bring the mold 2 and an imprint material 7 supplied or arranged onto the substrate 1 into contact with each other, and apply curing energy to the imprint material 7, thereby forming a pattern of a cured product to which a concave-convex pattern of the mold 2 has been transferred. For example, the imprint apparatus 1000 supplies the imprint material 7 onto the substrate 1, and cures the imprint material 7 in a state in which the mold 2 including the concave-convex pattern is in contact with the imprint material 7 on the substrate 1. Then, the imprint apparatus 1000 can increase the interval between the mold 2 and the substrate 1 to separate (mold separation) the mold 2 from the cured product of the imprint material 7, thereby transferring the pattern of the mold 2 to the imprint material 7 on the substrate 1. The series of processes can be understood as an imprint process. If the substrate 1 includes a plurality of shot regions, the imprint process can be performed for each of the plurality of shot regions. That is, if the imprint process is performed for each of the plurality of shot regions of one substrate 1, the imprint process is repeatedly performed the number of times which is equal to the number of shot regions of the one substrate 1.

As the imprint material, a curable composition (to be also referred to a resin in an uncured state) to be cured by receiving curing energy is used. As the curing energy, an electromagnetic wave or heat can be used. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The imprint material may be supplied onto the substrate in the form of a film by a spin coater or a slit coater. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor (Si, GaN, SiC, or the like), a resin, or the like can be used. A member made of a material different from the substrate may be provided on the surface of the substrate, as needed. The substrate is, for example, a silicon wafer, a compound semiconductor wafer, or silica glass.

The imprint apparatus 1000 includes, on a given side surface, a mechanical structure 100 and a control system 200. The mechanical structure 100 will be described. The imprint apparatus 1000 includes a main body structure 101, and the main body structure 101 can be installed on a floor via three or four vibration isolation mechanisms 102 using air springs or the like. The imprint apparatus 1000 can include a stage 13 as a first movable part. The stage 13 is configured to hold the substrate 1. In one example, a substrate chuck 11 can be amounted on the stage 13 and the substrate 1 can be held by the substrate chuck 11. The stage 13 can be arranged to be movable with strokes in the X and Y directions enough to perform an imprint process for each of the plurality of shot regions of the substrate 1. The stage 13 can be arranged to be movable to a replacement position for loading and unloading the substrate 1 by a substrate replacement hand (not shown).

For example, the stage 13 can be guided to be movable in the X direction using a static pressure guide, and can be applied with a driving force in the X direction by a linear motor 19 (actuator). Furthermore, a Y stage (not shown) can be arranged, on the stage 13, to be movable in the Y direction by the static pressure guide and the linear motor. The linear motor 19 can be driven by a current driver 14 (driving circuit). The stage 13, the linear motor 19, and the current driver 14 form a positioning mechanism that positions the substrate 1 as a positioning target object. A positioning unit is not limited to this arrangement. For example, a higher precision positioning mechanism such as a positioning mechanism for an exposure apparatus may be adopted.

The position in the X direction of the stage 13 can be measured by a stage position measurement unit 18. The stage position measurement unit 18 forms a first measurement device that measures a motion of the stage 13 as the first movable part. The stage position measurement unit 18 can include, for example, a linear encoder, and the linear encoder can include a scale (not shown) arranged on the main body structure 101, a head arranged on the stage 13, and a calculation unit that calculates the position based on an output from the head. Similarly, a Y-axis linear encoder (not shown) that measures the position in the Y direction of the stage 13 (or the Y stage on the stage 13) can also be provided. The position of the stage 13 may be measured by a measurement device including an interferometer provided in the main body structure 101 and a reflecting mirror provided in the stage 13.

The curable composition as the imprint material 7 can be supplied or arranged by a dispenser 107 at the position of a shot region of the substrate 1. The imprint material can be arranged in the shot region by causing the dispenser 107 to discharge the imprint material 7 while moving the stage 13. After that, the stage 13 can be positioned so that the shot region of the substrate 1 is positioned at a position immediately below the mold 2. The mold 2 as the second member can be held by an imprint head 23 as a second movable part. The imprint head 23 can be driven in the Z direction by an actuator 29, thereby driving the mold 2 in the Z direction.

Until the shot region of the substrate 1 moves to a position immediately below the mold 2, the mold 2 stands by at a position above the substrate 1 in the Z direction. If the shot region of the substrate 1 is positioned at the position immediately below the mold 2, the mold 2 is lowered by the actuator 29, thereby pressing the pattern part of the mold 2 against the imprint material 7. If a semiconductor device or the like is manufactured by the imprint apparatus 1000, when transferring the pattern of the mold 2 to the substrate 1 (the imprint material 7 on the substrate 1), it is important to align the preceding layer and the mold 2. This alignment operation is called alignment.

An alignment detector 106 performs image processing by optically detecting an image formed by a first mark provided in the substrate 1 and a second mark provided in the mold 2, thereby detecting a positional shift between the first mark and the second mark (a positional shift between the substrate 1 and the mold 2) in the X and Y directions. The alignment detector 106 forms a generator that generates an observed value concerning a relative motion between the stage 13 as the first movable part and the imprint head 23 as the second movable part. The generator or the alignment detector 106 can be understood as an example of a relative measurement device that measures a relative motion or a relative position.

An output from the alignment detector 106, that is, the detection result of the positional shift between the substrate 1 and the mold 2 is sent to the control system 200. The control system 200 controls, based on the detection result, alignment of correcting the position in the X and Y directions of the stage 13 or the imprint head 23.

Upon completion of alignment, an illumination system 108 illuminates the imprint material 7 with curing light, thereby curing the imprint material 7. After the imprint material 7 is cured, the mold 2 is raised by the actuator 29, thereby separating the mold 2 from the cured product of the imprint material 7 on the substrate 1. With the series of steps, a pattern corresponding to the pattern of the mold 2 is transferred to the imprint material 7 on the substrate 1.

Similarly, if the imprint process is completed for all the shot regions, as pattern formation targets, of the substrate 1 by sequentially performing the imprint process for the remaining shot regions of the substrate 1, the stage 13 can be moved to the substrate replacement position. Then, the substrate 1 can be collected by the substrate replacement hand (not shown), and the next substrate 1 can be supplied to the stage 13.

Figure 2:
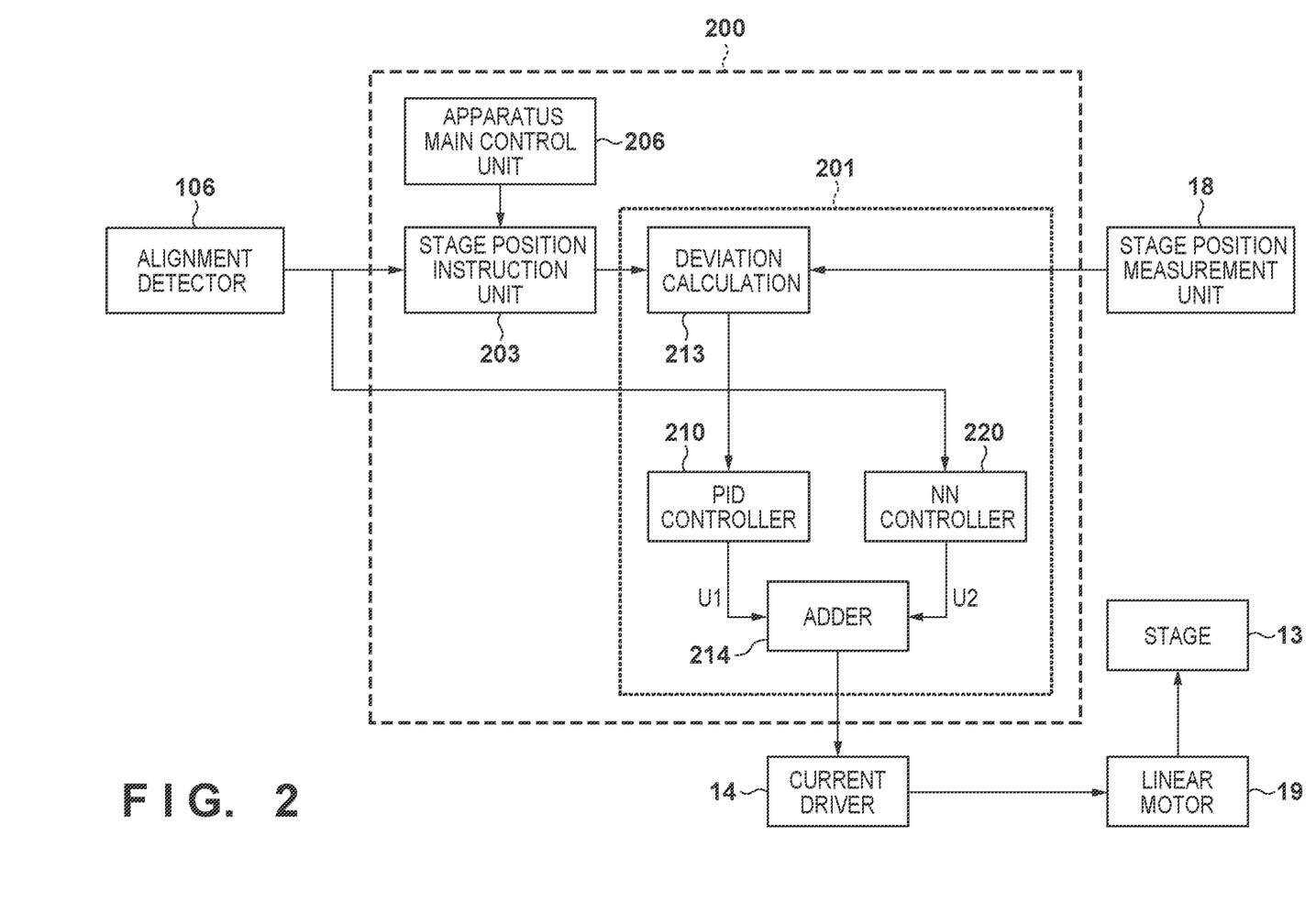
FIG. 2 is a schematic view of a control system according to the first embodiment.

FIG. 2 is a view showing an outline of the control system 200 according to the first embodiment. A part in a broken line indicates the control system 200, and the control system 200 can be formed by a digital computer to perform complicated calculation. The control system 200 can include, for example, an arithmetic processing unit such as a CPU or FPGA and a storage device such as a memory. The control system 200 forms a motion control apparatus. An apparatus main control unit 206 is a control unit that controls the overall imprint apparatus 1000, and can have a function of sending commands to a stage control unit 201 and another control unit (not shown) in addition to a function of performing sequence management of a job executed by the imprint apparatus 1000.

A stage position instruction unit 203 can acquire the target value of the position of the stage 13 from the apparatus main control unit 206, store it, and send it to the stage control unit 201. Positional shift information indicating the positional shift between the substrate 1 and the mold 2 detected by the alignment detector 106 can be sent to the stage position instruction unit 203 and reflected on control of the position of the stage 13. The stage position measurement unit 18 can measure the position of the stage 13 at every sampling time, and send the measured value (to be referred to as the stage position hereinafter) of the position of the stage 13 to the stage control unit 201.

In the stage control unit 201, a deviation calculation unit 213 calculates the difference between the stage position sent from the stage position measurement unit 18 and the target value of the position of the stage 13 sent from the stage position instruction unit 203, that is, a control deviation (to be referred to as a stage deviation hereinafter). A PID controller 210 as a first compensator generates and outputs, based on the stage deviation provided from the deviation calculation unit 213, a first manipulated variable U1 for controlling the stage 13.

In the first embodiment, as shown in FIG. 2, the positional shift information indicating the positional shift between the substrate 1 and the mold 2 detected by the alignment detector 106 as the generator that generates the observed value is sent to a neural network (NN) controller 220 as a second compensator. The NN controller 220 can be formed by a control system including a neural network. The NN controller 220 generates and outputs, based on the positional shift information indicating the positional shift between the substrate 1 and the mold 2, a second manipulated variable U2 for reducing the positional shift. That is, in the first embodiment, the PID controller 210 mainly functions as a component of a position feedback control system. On the other hand, the NN controller 220 functions as a component for suppressing the positional shift between the substrate 1 and the mold 2 that is difficult to be reduced by feedback control of the position of the stage 13 (substrate) by the PID controller 210.

The positional shift information indicating the positional shift between the substrate 1 and the mold 2 detected by the alignment detector 106 may be filtered before being sent to the NN controller 220. A filter for performing such filtering can be, for example, a cutoff filter that removes a predetermined frequency component. The cutoff filter can be, for example, a low-pass filter, a high-pass filter, or a bandpass filter.

Figure 3:
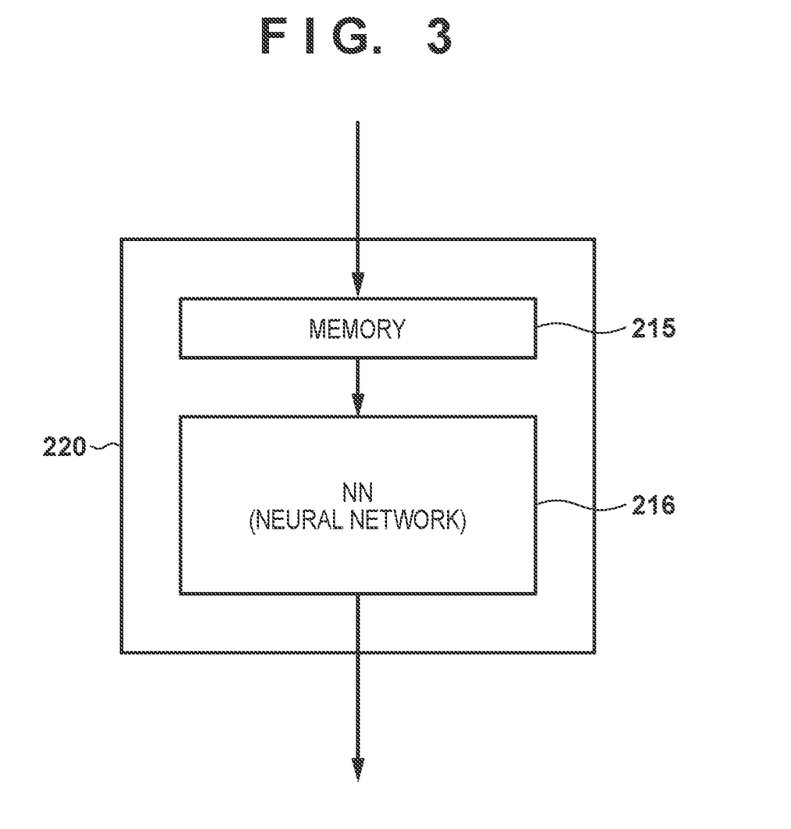
FIG. 3 is a schematic view exemplifying the arrangement of a neural network (NN) controller.

FIG. 3 exemplifies the arrangement of the NN controller 220. The NN controller 220 can include a memory 215 that saves the history of the stage deviation, and a neural network (NN) 216. The memory 215 can save a stage deviation corresponding to the last N steps (N is a natural number). For example, the NN 216 can be adjusted in advance to input, to an input layer, the stage deviation corresponding to the N steps saved in the memory 215, and output, from an output layer, the second manipulated variable U2 corresponding to a correction value for correcting the output (first manipulated variable U1) from the PID controller 210.

The parameter values of the NN 216 are decided in advance by some method. The parameter values of the NN 216 can be decided by, for example, machine learning such as reinforcement learning. The NN may be a network (policy network) that outputs data corresponding to the dimension of an instruction value or a network (action value network) that calculates the value of the instruction value. In the case of the action value network, a selection unit that selects an action whose value is largest is provided on the succeeding stage of the NN, and an instruction value selected by the selection unit is the output (second manipulated variable U2) from the NN controller 220.

An adder 214 generates a manipulated variable for controlling the linear motor 19 (stage 13) by adding the output value (first manipulated variable U1) generated by the PID controller 210 and the output value (second manipulated variable U2) generated by the NN controller 220. The adder 214 forms a calculator that generates a manipulated variable for controlling the linear motor 19 (stage 13) based on the output value (first manipulated variable U1) generated by the PID controller 210 and the output value (second manipulated variable U2) generated by the NN controller 220. In one example, the output from the adder 214 can be converted into an analog signal by a D/A converter (not shown), and sent to the current driver 14. The current driver 14 controls a current value flowing into the coil of the linear motor 19 in accordance with the output from the adder 214. Since the thrust of the linear motor 19 is proportional to the current flowing into the coil, a force corresponding to the sum of the output value of the PID controller 210 and the output value of the NN controller 220 can be applied to the stage 13.

As described above, in the first embodiment, the output (second manipulated variable U2) from the NN controller 220 that receives the positional shift information between the substrate 1 and the mold 2 detected by the alignment detector 106 is added to the output value (first manipulated variable U1) of the PID controller 210. This applies, to the stage 13, a force for reducing the positional shift between the substrate 1 and the mold 2, thereby making it possible to reduce the positional shift between the substrate 1 and the mold 2.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as at least some of the constituent members of the above-described articles or used temporarily as a resist mask. After etching or ion implantation is performed in the substrate processing step, the resist mask is removed.

Figure 10A:
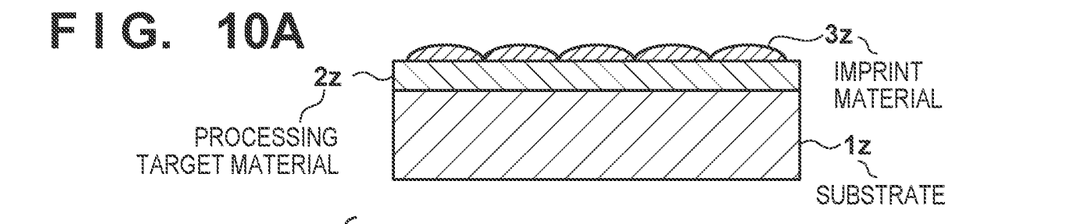
FIGS. 10A to 10F are views exemplifying an imprint method.

An article manufacturing method in which an imprint apparatus forms a pattern on a substrate, processes the substrate on which the pattern has been formed, and manufactures an article from the processed substrate will be described next. As shown FIG. 10A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 10B:
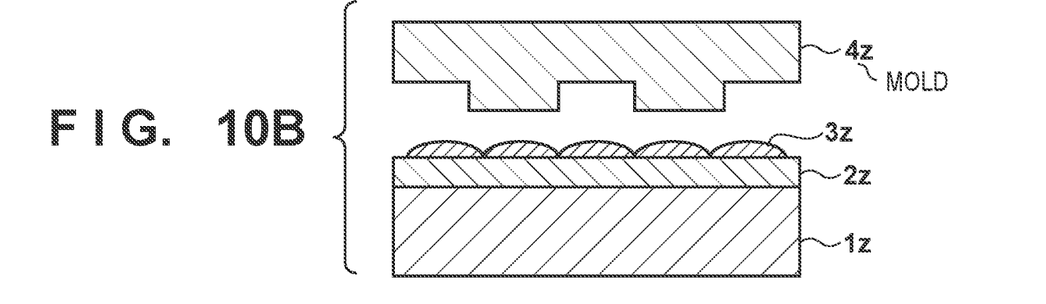
Figure 10C:
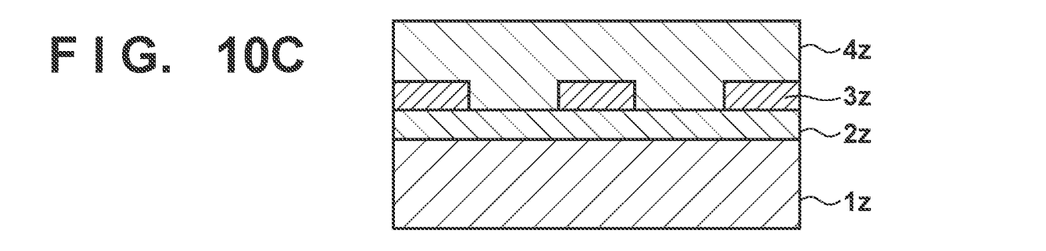

As shown in FIG. 10B, a side of a mold 4z for imprint with a concave-convex pattern is directed to face the imprint material 3z on the substrate. As shown FIG. 10C, the substrate 1z to which the imprint material 3z has been applied is brought into contact with the mold 4z, and a pressure is applied. The gap between the mold 4z and the processed material 2z is filled with the imprint material 3z. In this state, when the imprint material 3z is irradiated with light as curing energy via the mold 4z, the imprint material 3z is cured.

Figure 10D:
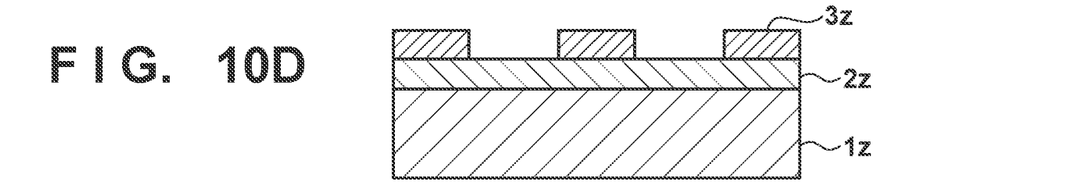

As shown in FIG. 10D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

Figure 10E:
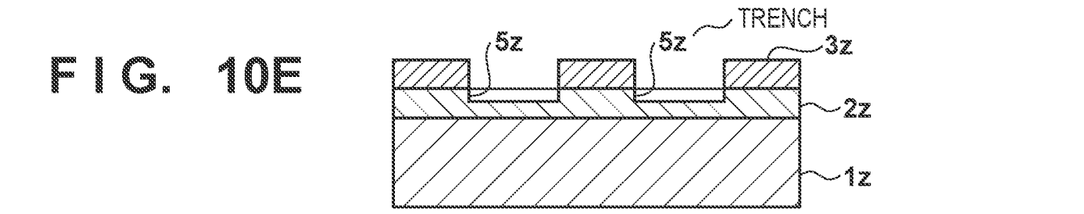
Figure 10F:
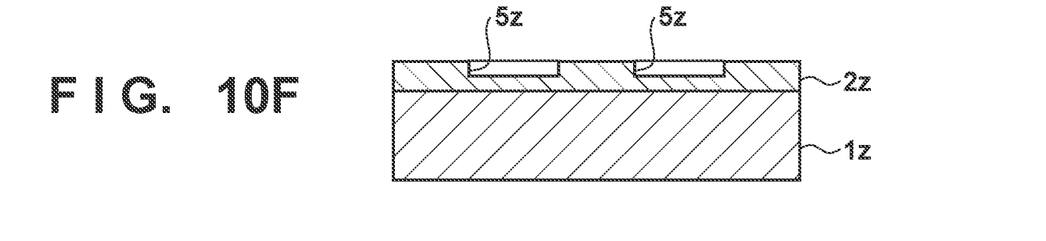

As shown in FIG. 10E, when etching is performed using the pattern of the cured product as an etching resistant mask, a portion of the surface of the processed material 2z where the cured product does not exist or remains thin is removed to form a groove 5z. As shown in FIG. 10F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

Second Embodiment

The second embodiment will be described below. Matters not mentioned in the second embodiment can comply with the first embodiment. In the above-described first embodiment, as the input to the NN controller 220, that is, the observed value concerning the relative motion between the substrate 1 and the mold 2, the positional shift information indicating the positional shift between the substrate 1 and the mold 2 detected by the alignment detector 106 is used. On the other hand, in the second embodiment, as the observed value, a relative acceleration between a substrate 1 and a mold 2 is used.

Figure 4:
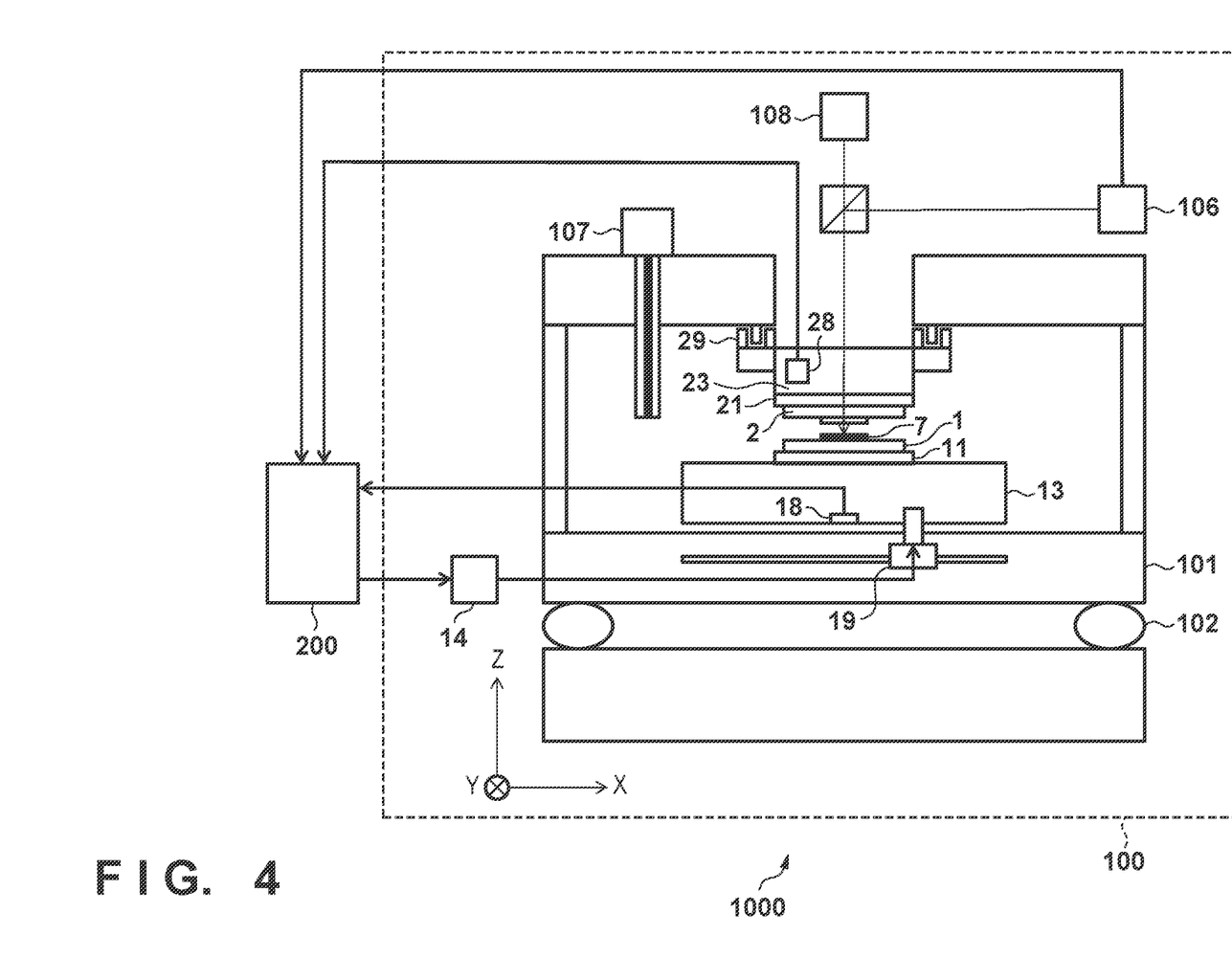
FIG. 4 is a schematic view showing the arrangement of an imprint apparatus according to the second embodiment.

FIG. 4 is a schematic view of an imprint apparatus 1000 according to the second embodiment. The imprint apparatus 1000 of the second embodiment also provides an example of a lithography apparatus. The imprint apparatus 1000 of the second embodiment includes, as a first measurement device, a stage position measurement unit 18 that measures the position of a stage 13. The imprint apparatus 1000 of the second embodiment includes, as a second measurement device, an acceleration measurement unit 28 that measures the acceleration of an imprint head 23. The acceleration of the imprint head 23 measured by the acceleration measurement unit 28 is sent to a control system 200, more specifically, a difference calculator 222 of a stage control unit 201, as shown in FIG. 5.

In the second embodiment, the stage control unit 201 obtains the acceleration of the stage 13 by differentiating a measured value of the stage position measurement unit 18 by a second order differentiator 221, and sends the acceleration to the difference calculator 222. The difference calculator 222 calculates the relative acceleration between the stage 13 and the imprint head 23 by calculating the difference between the acceleration of the imprint head 23 and that of the stage 13, and sends the obtained relative acceleration to an NN controller 220 as a second compensator. The stage position measurement unit 18, the second order differentiator 221, the acceleration measurement unit 28, and the difference calculator 222 form a generator that generates an observed value concerning the relative motion between the stage 13 as a first movable part and the imprint head 23 as a second movable part. The second order differentiator 221 and the difference calculator 222 correspond to an example of a calculator that generates an observed value based on an output from the stage position measurement unit 18 as the first measurement device and an output from the acceleration measurement unit 28 as the second measurement device. The NN controller 220 generates and outputs, based on relative acceleration information indicating the relative acceleration between the substrate 1 and the mold 2, a second manipulated variable U2 for reducing the relative acceleration.

Figure 5:
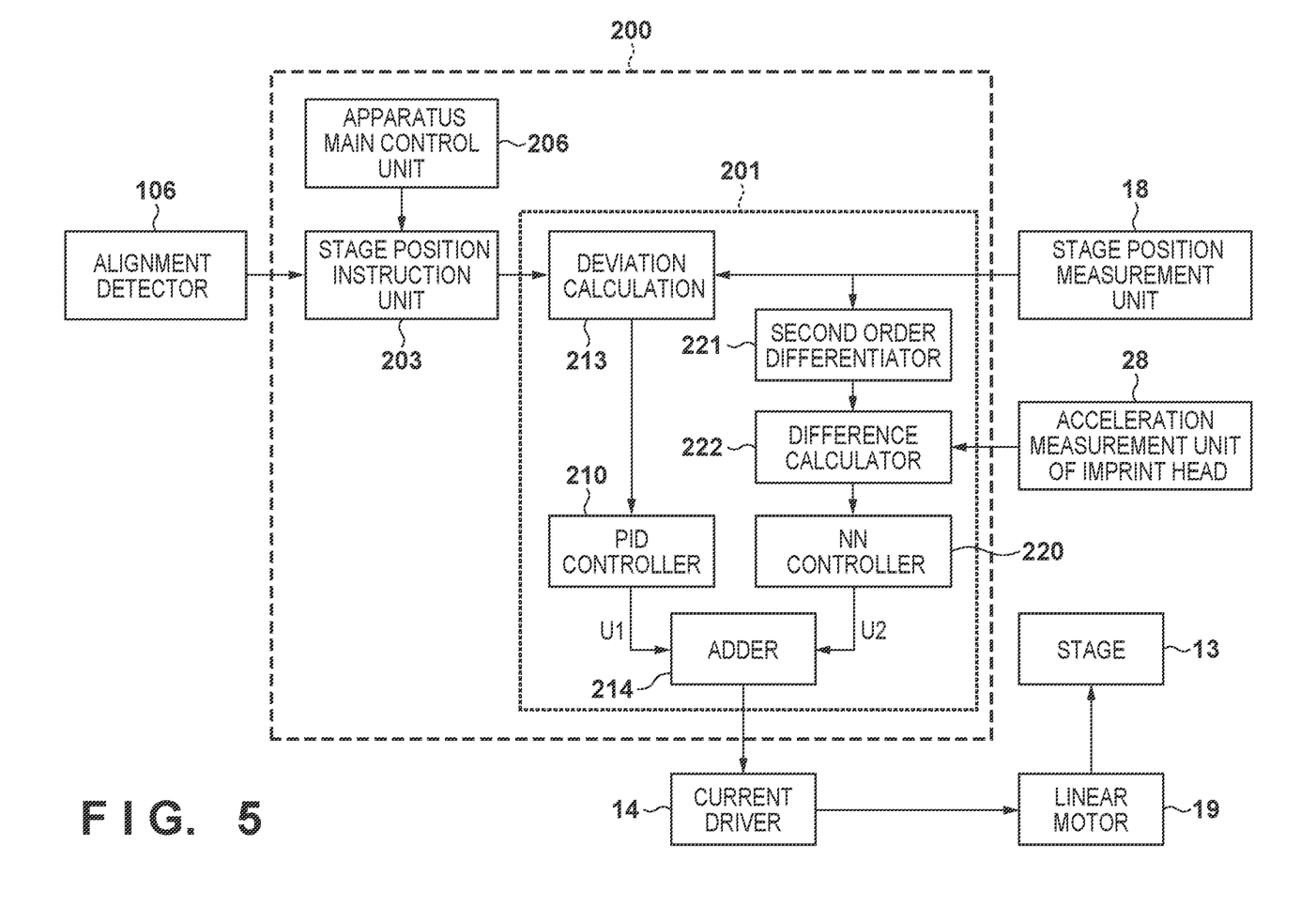
FIG. 5 is a schematic view of a control system according to the second embodiment.

In an example shown in FIG. 5, a physical amount measured by the stage position measurement unit 18 is information including the dimension of a length (m) (an example of the first dimension), and a physical amount measured by the acceleration measurement unit 28 is information including the dimension of an acceleration ($m/s^2$) (an example of the second dimension). In the generator that generates the observed value concerning the relative motion between the stage 13 and the imprint head 23, the second order differentiator 221 forms a dimension converter that converts an output of the first dimension from the stage position measurement unit 18 as the first measurement device into information indicating a motion of the second dimension. Instead of this arrangement, a dimension converter that converts an output of the second dimension from the acceleration measurement unit 28 as the second measurement device into information indicating a motion of the first dimension may be provided, and the difference calculator 222 may calculate the difference between the output from the stage position measurement unit 18 and the output from the dimension converter. The stage control unit 201 may be configured so that the dimension converter is one of a first order differentiator, a second order differentiator, a first order integrator, and a second order integrator.

In the second embodiment, the information indicating the relative acceleration between the stage 13 and the imprint head 23 is input to the NN controller 220, thereby making it possible to reduce the relative acceleration between the stage 13 and the imprint head 23. The information indicating the relative acceleration between the stage 13 and the imprint head 23 may be filtered before being sent to the NN controller 220. A filter for performing such filtering can be, for example, a cutoff filter that removes a predetermined frequency component. The cutoff filter can be, for example, a low-pass filter, a high-pass filter, or a bandpass filter.

As described above, in the second embodiment, the output (second manipulated variable U2) from the NN controller 220 that receives the relative acceleration information between the stage 13 and the imprint head 23 is added to the output value (first manipulated variable U1) of the PID controller 210. This applies, to the stage 13, a force for reducing the relative acceleration between the substrate 1 and the mold 2, thereby making it possible to reduce the relative acceleration between the substrate 1 and the mold 2.

The generator that generates the observed value concerning the relative motion between the stage 13 as the first movable part and the imprint head 23 as the second movable part may include, for example, a measurement device that measures the relative motion.

Third Embodiment

Figure 6:
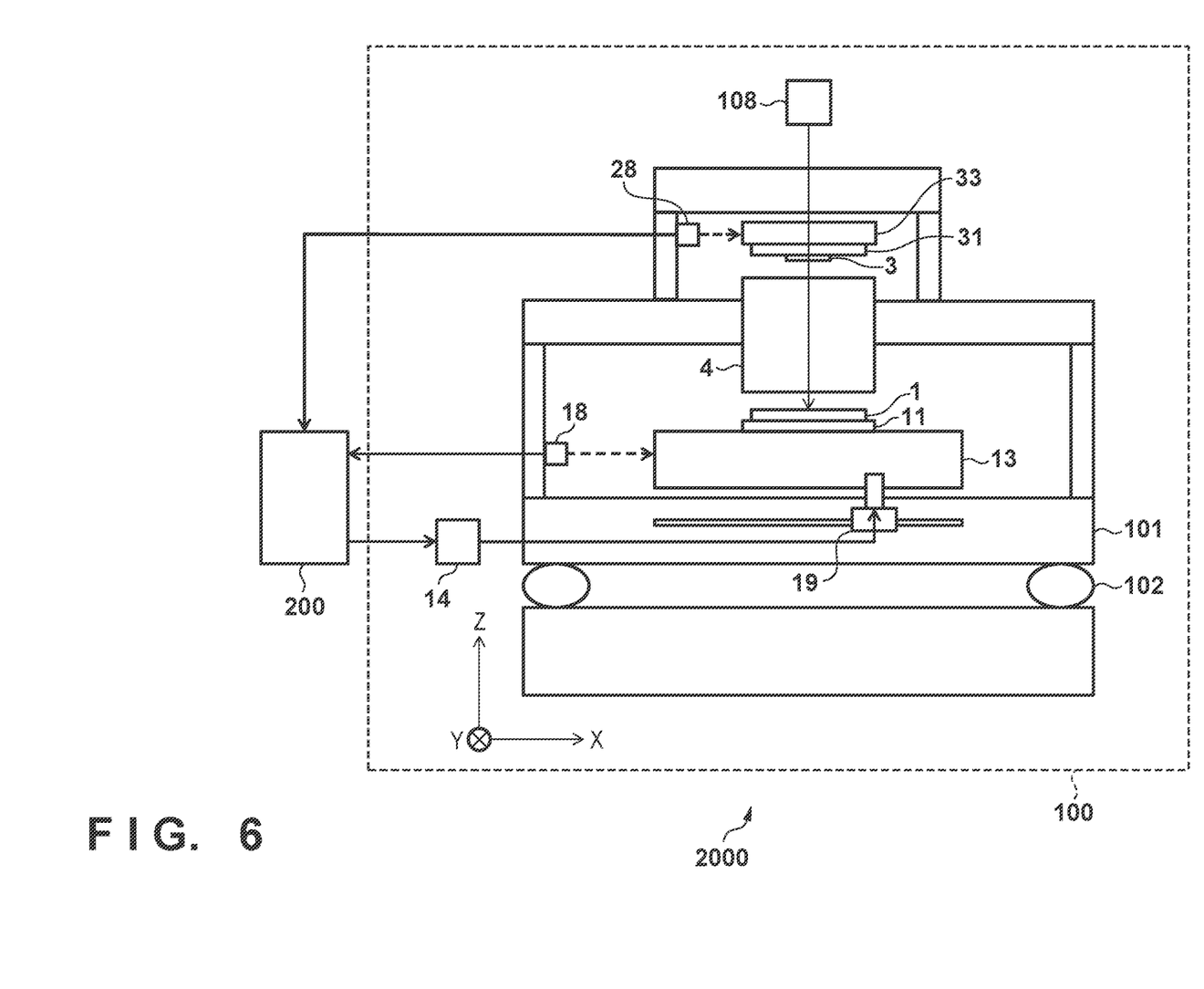
FIG. 6 is a schematic view showing the arrangement of an exposure apparatus according to the third embodiment.

The third embodiment will be described below. Matters not mentioned in the third embodiment can comply with the first or second embodiment. The third embodiment provides an exposure apparatus as another example of a lithography apparatus. FIG. 6 is a schematic view of an exposure apparatus 2000 according to the third embodiment. The position in the X direction of a stage 13 (substrate stage) can be measured by a stage position measurement unit 18. The stage position measurement unit 18 forms a first measurement device that measures the motion of the stage 13 as a first movable part. The stage position measurement unit 18 can include, for example, a laser interferometer. Similarly, a Y-axis laser interferometer (not shown) that measures the position in the Y direction of the stage 13 (or a Y stage on the stage 13) can be provided.

The exposure apparatus 2000 includes a mask stage 33 as a second movable part that holds a mask 3 as a second member. In one example, a mask chuck 31 is mounted on the mask stage 33, and can hold the mask 3.

The position in the X direction of the mask stage 33 can be measured by a mask stage position measurement unit 28. The mask stage position measurement unit 28 can include, for example, a laser interferometer. The mask stage position measurement unit 28 can form a second measurement device that measures the motion of the mask stage 33 as the second movable part. With respect to the Y direction as well, a laser interferometer (not shown) is provided.

The exposure apparatus 2000 further includes a projection optical system 4 that projects the pattern of the mask 3 onto a substrate 1. The substrate 1 includes a photoresist. When the projection optical system 4 projects the pattern of the mask 3 onto the substrate 1, the photoresist (substrate 1) is exposed, and the pattern of the mask 3 can be transferred as a latent image to the photoresist (substrate 1).

Figure 7:
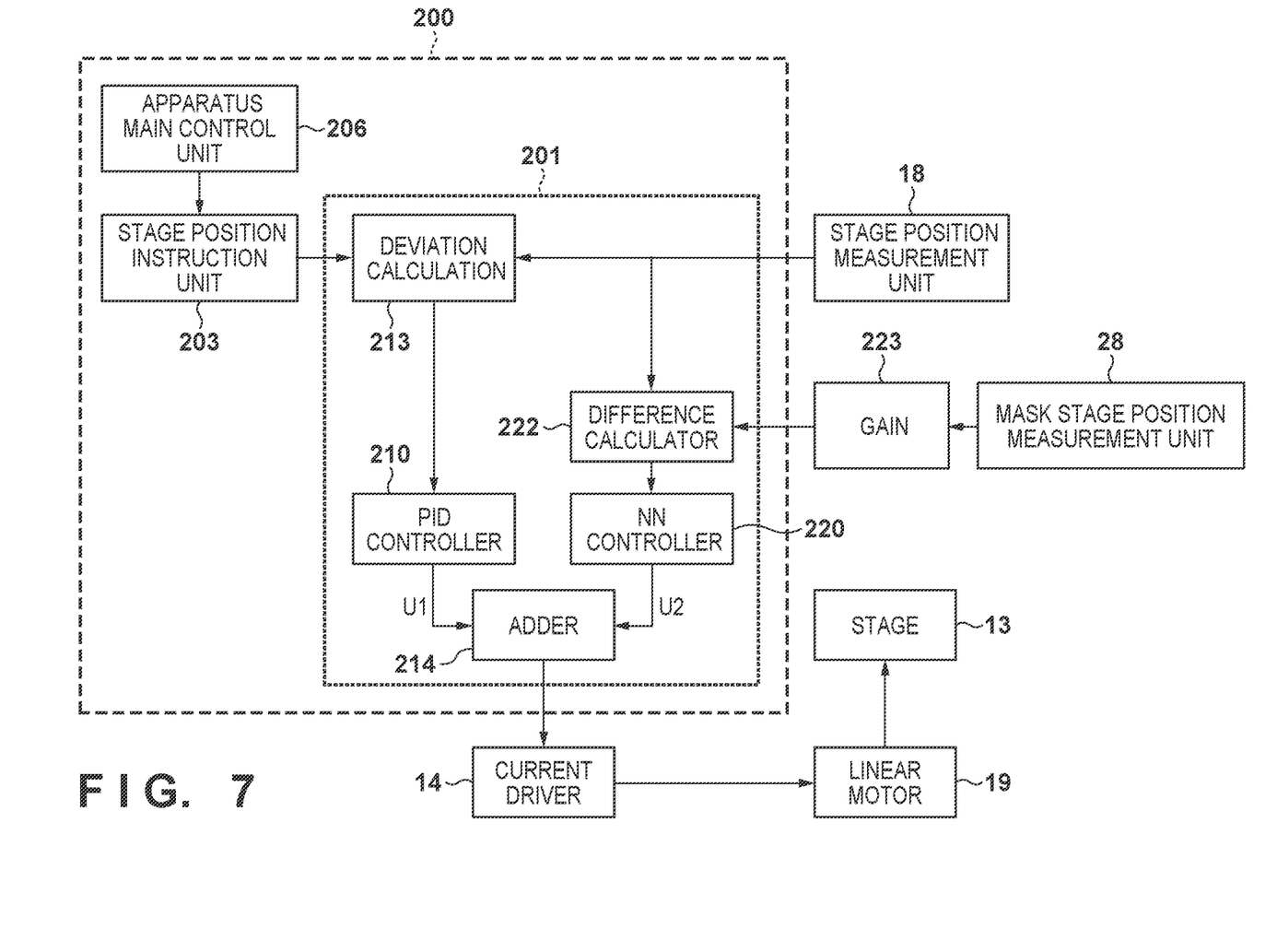
FIG. 7 is a schematic view of a control system according to the third embodiment.

As shown in FIG. 7, the measured value (substrate stage position) of the position of the stage 13 measured by the stage position measurement unit 18 is sent to a control system 200, more specifically, a stage control unit 201. In addition, the measured value (mask stage position) of the position of the mask stage 33 measured by the mask stage position measurement unit 28 is also sent to the stage control unit 201. The substrate stage position measured by the stage position measurement unit 18 can be sent to a difference calculator 222 in addition to a deviation calculation unit 213. The deviation calculation unit 213 calculates the difference between the substrate stage position sent from the stage position measurement unit 18 and the target value of the position of the stage 13 sent from a stage position instruction unit 203, that is, a control deviation (to be referred to as a stage deviation hereinafter).

The mask stage position measured by the mask stage position measurement unit 28 can be multiplied by a gain by a gain multiplier 223, and then sent to the difference calculator 222. The gain can include the projection magnification of the projection optical system 4. The gain may further include a positive or negative sign. The difference calculator 222 calculates the difference between the substrate stage position measured by the stage position measurement unit 18 and the mask stage position measured by the mask stage position measurement unit 28 and multiplied by the gain by the gain multiplier 223, and sends the difference to an NN controller 220. This difference indicates the relative position (relative motion) between the stage 13 and the mask stage 33, that is, a synchronous error.

The NN controller 220 generates and outputs, based on the relative position between the stage 13 and the mask stage 33, that is, the synchronous error, a second manipulated variable U2 for reducing the synchronous error. The adder 214 generates a manipulated variable for controlling a linear motor 19 (the stage 13) by adding an output value (a first manipulated variable U1) generated by the PID controller 210 and the output value (second manipulated variable U2) generated by the NN controller 220.

The relative position between the stage 13 and the mask stage 33, that is, the synchronous error may be filtered before being sent to the NN controller 220. A filter for performing such filtering can be, for example, a cutoff filter that removes a predetermined frequency component. The cutoff filter can be, for example, a low-pass filter, a high-pass filter, or a bandpass filter.

As described above, in the third embodiment, the output (second manipulated variable U2) from the NN controller 220 that receives the synchronous error between the stage 13 and the mask stage 33 is added to the output value (first manipulated variable U1) of the PID controller 210. This applies, to the stage 13, a force for reducing the synchronous error between the stage 13 and the mask stage 33, thereby reducing the synchronous error.

In the third embodiment, the second manipulated variable U2 based on the synchronous error between the stage 13 and the mask stage 33 is added to the first manipulated variable U1 output from the PID controller 210 to control the stage 13. Instead, the second manipulated variable U2 may be used to correct the manipulated variable for controlling the mask stage 33.

Furthermore, in the third embodiment, the relative position between the stage 13 and the mask stage 33 is supplied to the NN controller 220. However, the relative speed or relative acceleration between the stage 13 and the mask stage 33 may be supplied to the NN controller 220.

Fourth Embodiment

Figure 8:
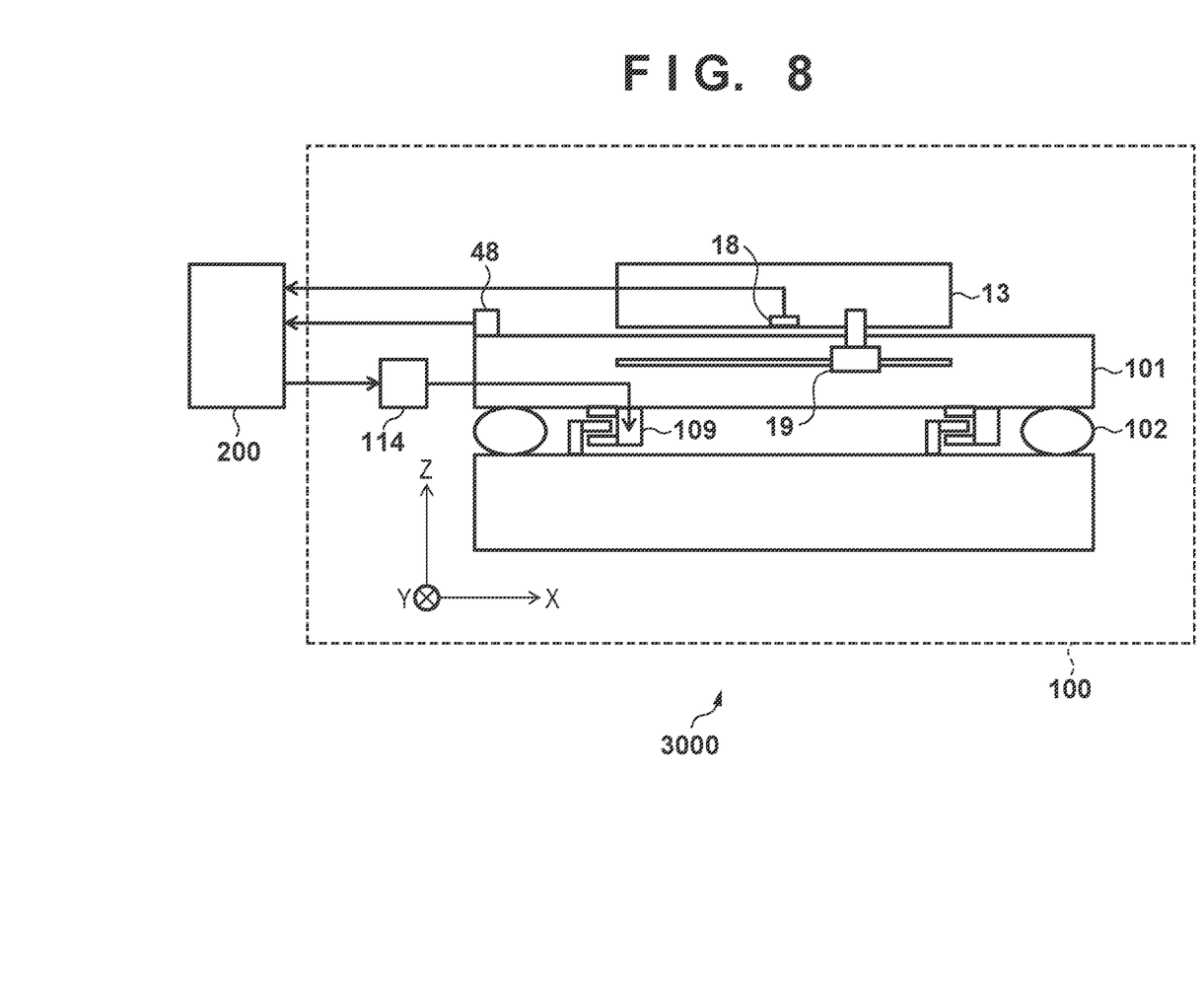
FIG. 8 is a schematic view showing the arrangement of a vibration isolation apparatus according to the fourth embodiment.

The fourth embodiment will be described below. Matters not mentioned in the fourth embodiment can comply with the first to third embodiments. The fourth embodiment provides an example in which the present invention is applied to a vibration isolation apparatus including a stage. FIG. 8 is a schematic view of a vibration isolation apparatus 3000 according to the fourth embodiment. A stage 13 as a second movable part is mounted on a main body structure (vibration isolation table) 101 as a first movable part. A stage position measurement unit 18 measures a relative position between the main body structure 101 and the stage 13, that is, a positional shift between the main body structure 101 and the stage 13. The stage position measurement unit 18 forms a generator that generates an observed value concerning a relative motion between the main body structure 101 and the stage 13.

Figure 9:
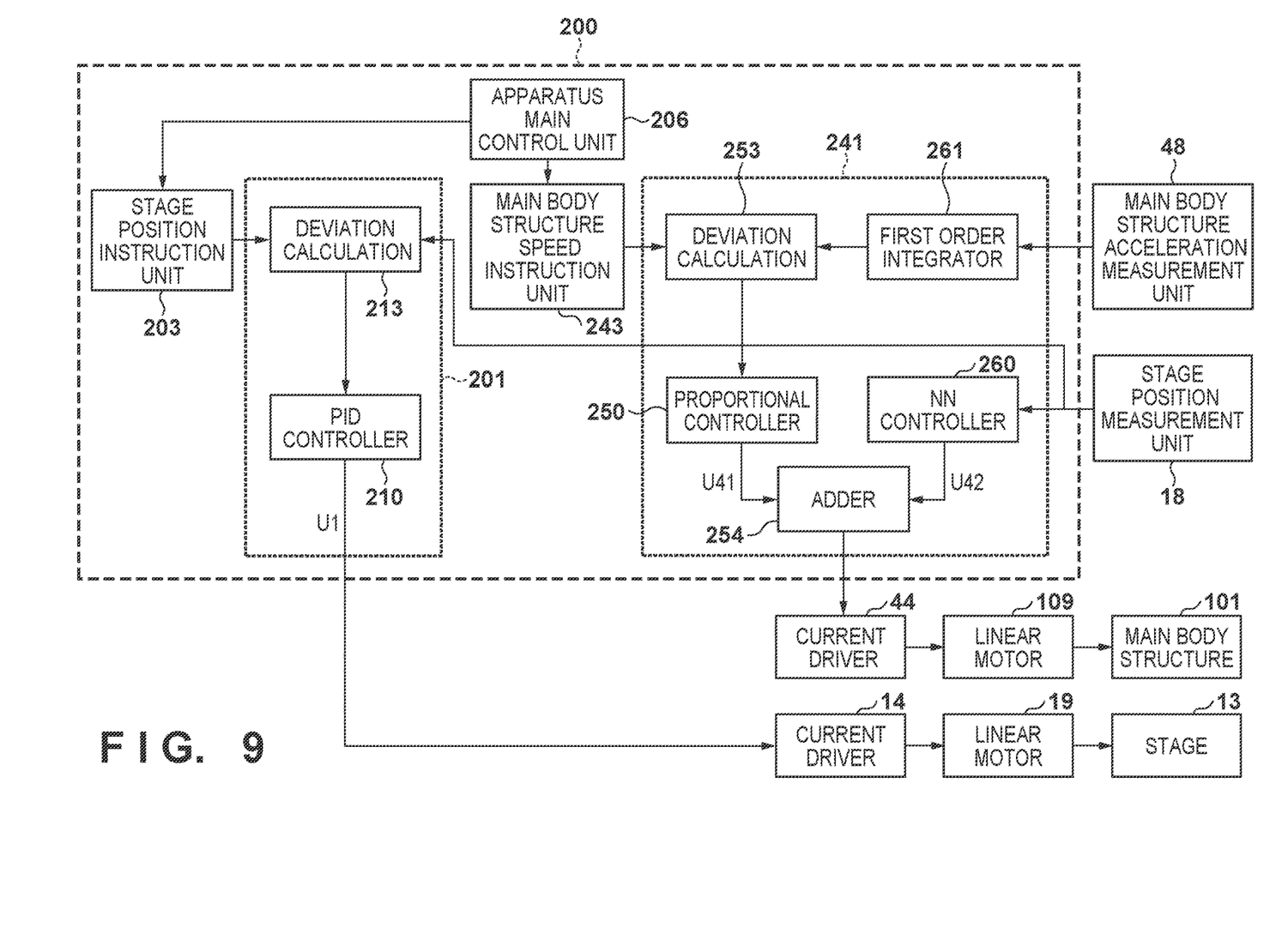
FIG. 9 is a schematic view of a control system according to the fourth embodiment.

As shown in FIG. 9, the positional shift measured by the stage position measurement unit 18 is sent to a control system 200. An acceleration measurement unit 48 measures the acceleration of the main body structure 101 as the first movable part. The measured value of the acceleration measurement unit 48 is sent to the control system 200. The positional shift measured by the stage position measurement unit 18 is provided to a deviation calculation unit 213 of a stage control unit 201 and an NN controller 260 of a vibration isolation apparatus control unit 241. A PID controller 210 of the stage control unit 201 generates and outputs a manipulated variable U1 for controlling the stage 13 as the second movable part.

The vibration isolation apparatus control unit 241 obtains the speed of the main body structure 101 by integrating, by a first order integrator 261, the acceleration of the main body structure 101 provided from the acceleration measurement unit 48. After that, a deviation calculation unit 253 calculates the difference (to be referred to as a speed deviation hereinafter) between the speed of the main body structure 101 and a target value of the speed of the main body structure 101 provided from a speed instruction unit 243, and sends the speed deviation to a proportional control unit 250. Based on the speed deviation, the proportional control unit 250 generates and outputs a first manipulated variable U41 for controlling the main body structure 101. The first manipulated variable U41 can be converted into an analog signal by a D/A converter (not shown), and sent to a current driver 44. Since the thrust of a linear motor 19 is proportional to a current flowing into a coil, a force corresponding to the output value from the proportional control unit 250 is applied to the main body structure 101.

In the fourth embodiment, as shown in FIG. 9, the positional shift between the main body structure 101 and the stage 13 (the relative position of the stage 13 with respect to the main body structure 101) measured by the stage position measurement unit 18 is sent to the NN controller 260. The NN controller 260 generates and outputs, based on the positional shift, a second manipulated variable U42 to reduce the positional shift between the main body structure 101 and the stage 13. The measured value of the stage position measurement unit 18 may be filtered before being sent to the NN controller 220. A filter for performing such filtering can be, for example, a cutoff filter that removes a predetermined frequency component. The cutoff filter can be, for example, a low-pass filter, a high-pass filter, or a bandpass filter.

As described above, in the fourth embodiment, the output (second manipulated variable U42) from the NN controller 260 that receives the positional shift between the main body structure 101 and the stage 13 measured by the stage position measurement unit 18 is added to the output value (first manipulated variable U41) of the proportional control unit 250. This applies, to the main body structure 101, a force for reducing the positional shift between the main body structure 101 and the stage 13, thereby making it possible to reduce the positional shift between the main body structure 101 and the stage 13.

In the fourth embodiment, the speed of the main body structure 101 is obtained by integrating, by the first order integrator 261, the accelerator of the main body structure 101 measured by the acceleration measurement unit 48. However, the speed of the main body structure 101 may be measured directly by using a speed meter.

Fifth Embodiment

The lithography apparatus exemplified as the first or second embodiment may be changed to a planarization apparatus that forms a planarized film by planarizing a curable composition on a substrate using a mold including no pattern instead of a mold including a pattern. In such planarization apparatus as well, a motion control apparatus can be applied to control the motion of a movable part that holds the substrate or the mold.

The present invention is not limited to the lithography apparatus, the planarization apparatus, and the like, and is applicable to various kinds of processing apparatuses that process a member held by a first movable part or a second movable part while controlling a relative motion between the first movable part and the second movable part. The above-described lithography apparatus or planarization apparatus may be understood as an example of such processing apparatus. The processing apparatus may be configured as an apparatus that measures, inspects, observes, or processes a member held by the first movable part or the second movable part. Examples of the processing apparatus that measures the member are an apparatus including a contact probe and an apparatus including a noncontact interferometer. Examples of the processing apparatus that processes the member are an apparatus that processes the member using a tool and a processing apparatus that processes the member by a laser beam.

Article Manufacturing Method

Some article manufacturing methods will be exemplified below.

The first article manufacturing method can include a transfer step of transferring a pattern of a second member to a first member by a lithography apparatus represented by each of the first to third embodiments, and a processing step of obtaining an article by processing the first member having undergone the transfer step. The first member can be a substrate and the second member can be a mold or a mask.

The second article manufacturing method can include a planarization step of forming a planarized film on a member by a planarization apparatus represented by the fifth embodiment, and a processing step of obtaining an article by processing the member having undergone the planarization step. The member can be a substrate.

The third article manufacturing method can include a first processing step of processing a member by a processing apparatus represented by the fifth embodiment, and a second processing step of obtaining an article by further processing the member having undergone the first processing step. The member can be a substrate.

As a more practical article manufacturing method, an article manufacturing method using an imprint apparatus will be described below. The article manufacturing method is suitable for manufacturing an article, for example, a microdevice such as a semiconductor device or an element having a fine structure. The article manufacturing method according to this embodiment includes a step of forming a pattern on an imprint material supplied (applied) to a substrate using the above-described lithography apparatus (imprint method), and a step of processing the substrate on which the pattern has been formed in the above step. The manufacturing method also includes other known steps (for example, oxidation, deposition, vapor deposition, doping, planarization, etching, resist removal, dicing, bonding, and packaging). The article manufacturing method according to this embodiment is advantageous in at least one of the performance, quality, productivity, and production cost of the article, as compared to conventional methods.

A method of manufacturing an article (a semiconductor IC element, a liquid crystal display element, a color filter, a MEMS, or the like) by using the above-described exposure apparatus will be described next. The article is manufactured by performing, using the above-described exposure apparatus, a step of exposing a substrate (a wafer, a glass substrate, or the like) coated with a photosensitive agent, a step of developing the substrate (photosensitive agent), and a step of processing the developed substrate in other known processing steps. Other known steps include etching, resist removal, dicing, bonding, and packaging. This manufacturing method can manufacture an article with higher quality than the conventional methods.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-204437, filed Dec. 16, 2021, which is hereby incorporated by reference herein in its entirety.

What is claimed is:

1. A motion control apparatus comprising:
a first movable part;
a second movable part;
a first measurement device configured to measure a motion of the first movable part;
a first compensator configured to generate a first manipulated variable based on an output from the first measurement device and a target value for controlling the motion of the first movable part;
a generator configured to generate an observed value concerning a relative motion between the first movable part and the second movable part;
a second compensator configured to generate a second manipulated variable based on the observed value concerning the relative motion between the first movable part and the second movable part; and
a calculator configured to generate a manipulated variable for driving the first movable part based on the first manipulated variable generated by the first compensator and the second manipulated variable generated by the second compensator,
wherein for the second compensator, a parameter value for generating the second manipulated variable is decided by machine learning.

2. The apparatus according to claim 1, wherein the first measurement device measures one of a position, a speed, and an acceleration of the first movable part.

3. The apparatus according to claim 1, wherein the generator includes a relative measurement device configured to measure the relative motion between the first movable part and the second movable part.

4. The apparatus according to claim 3, wherein the relative measurement device measures, as the relative motion, a relative position between the first movable part and the second movable part.

5. The apparatus according to claim 3, wherein the relative measurement device measures a positional shift between a first mark provided in a first member mounted on the first movable part and a second mark provided in a second member mounted on the second movable part.

6. The apparatus according to claim 3, wherein the relative measurement device is mounted on one of the first movable part and the second movable part.

7. The apparatus according to claim 1, further comprising a second measurement device configured to measure a motion of the second movable part,
wherein the generator generates the observed value based on the output from the first measurement device and an output from the second measurement device.

8. The apparatus according to claim 7, wherein the second measurement device measures one of a position, a speed, and an acceleration of the second movable part.

9. The apparatus according to claim 7, wherein the generator includes a calculator configured to generate the observed value based on the output from the first measurement device and the output from the second measurement device.

10. The apparatus according to claim 7, wherein
the output from the first measurement device is information indicating a motion of a first dimension and the output from the second measurement device is information indicating a motion of a second dimension, and
the generator includes a dimension converter configured to convert the output from the first measurement device into the information indicating the motion of the second dimension, and a difference calculator configured to calculate a difference between an output from the dimension converter and the output from the second measurement device.

11. The apparatus according to claim 10, wherein the dimension converter is one of a first order differentiator, a second order differentiator, a first order integrator, and a second order integrator.

12. The apparatus according to claim 7, wherein
the output from the first measurement device is information indicating a motion of a first dimension and the output from the second measurement device is information indicating a motion of a second dimension, and
the generator includes a dimension converter configured to convert the output from the second measurement device into the information indicating the motion of the first dimension, and a difference calculator configured to calculate a difference between the output from the first measurement device and an output from the dimension converter.

13. The apparatus according to claim 1, wherein that the generator generates, as the observed value, a value obtained by filtering information concerning the relative motion between the first movable part and the second movable part.

14. A lithography apparatus including a motion control apparatus defined in claim 1, wherein
a first movable part is configured to hold a first member,
a second movable part is configured to hold a second member, and
the lithography apparatus is configured to transfer a pattern of the second member to the first member.

15. An article manufacturing method comprising:
transferring a pattern of a second member to a first member by a lithography apparatus defined in claim 14; and
obtaining an article by processing the first member having undergone the transferring.

16. A planarization apparatus including a motion control apparatus defined in claim 1, wherein
a first movable part is configured to hold a first member,
a second movable part is configured to hold a second member, and
the planarization apparatus is configured to planarize, using the second member, a curable composition arranged on the first member.

17. An article manufacturing method comprising:
forming a planarized film on a member by a planarization apparatus defined in claim 16; and
obtaining an article by processing the member having undergone the forming.

18. A processing apparatus including a motion control apparatus defined in claim 1, wherein
the processing apparatus is configured to process a member held by one of a first movable part and a second movable part while controlling a relative motion between the first movable part and the second movable part.

19. An article manufacturing method comprising:
processing a member by a processing apparatus defined in claim 18; and
obtaining an article by further processing the member having undergone the processing.

20. The apparatus according to claim 1, further comprising a deviation calculation unit configured to calculate a difference between the output from the first measurement device and the target value for controlling the motion of the first movable part,
wherein the first compensator is configured to generate the first manipulated variable based on the difference provided from the deviation calculation unit.

21. The apparatus according to claim 1, wherein the calculator includes an adder configured to generate the manipulated variable for driving the first movable part by adding the first manipulated variable generated by the first compensator and the second manipulated variable generated by the second compensator.

22. The apparatus according to claim 21, further comprising a current driver configured to drive a motor that is configured to drive the first movable part,
wherein the current driver is configured to drive the motor based on the manipulated variable generated by the adder.

23. The apparatus according to claim 1, wherein the first compensator is a PID controller.

24. The apparatus according to claim 1, wherein the second compensator is configured to generate the second manipulated variable so as to reduce a positional shift between a first member mounted on the first movable part and a second member mounted on the second movable part.

* * * * *